(12) United States Patent
Yang et al.

(10) Patent No.: US 6,514,871 B1
(45) Date of Patent: Feb. 4, 2003

(54) GATE ETCH PROCESS WITH EXTENDED CD TRIM CAPABILITY

(75) Inventors: Chih-Yuh Yang, San Jose, CA (US); Scott A. Bell, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/596,820

(22) Filed: Jun. 19, 2000

(51) Int. Cl.[7] .................. H01L 21/302; H01L 21/461
(52) U.S. Cl. .................. 438/725; 438/197; 438/299; 438/585; 438/710; 438/714; 438/733; 438/948; 430/313; 216/67
(58) Field of Search ................ 438/197, 585, 438/709, 714, 725, 947, 948, 286, 299, 303, 308, 531, 595, 713, 733, 739, 795, 710; 430/313

(56) References Cited

U.S. PATENT DOCUMENTS

| | | | |
|---|---|---|---|
| 5,139,904 A | * | 8/1992 | Auda et al. .................. 430/30 |
| 5,965,461 A | | 10/1999 | Yang et al. .................. 438/717 |
| 6,107,172 A | | 8/2000 | Yang et al. .................. 438/717 |
| 6,121,155 A | * | 9/2000 | Yang et al. .................. 438/725 |
| 6,153,477 A | * | 11/2000 | Gardner et al. .............. 438/179 |
| 6,183,937 B1 | * | 2/2001 | Tsai et al. ..................... 430/313 |
| 6,232,048 B1 | * | 5/2001 | Buynoski et al. ........... 430/328 |

FOREIGN PATENT DOCUMENTS

WO    WO-00/59024    * 10/2000

* cited by examiner

*Primary Examiner*—Matthew Smith
*Assistant Examiner*—Craig P. Lytle

(57) ABSTRACT

A method is provided herein for trim etching a resist line in a plasma etch apparatus. The method provides a reduced rate of vertical direction etching of the resist, and an increased rate of horizontal direction etching of the resist, by applying a lower biasing power to the plasma etch apparatus that is conventionally used. The resulting resist has an increased height in relation to its width which adds to the structural integrity of the resist line and significantly reduces problems of discontinuity in the resist line.

4 Claims, 4 Drawing Sheets

GATE ETCH PROCESS WITH EXTENDED CD TRIM CAPABILITY

BACKGROUND OF THE INVENTION

1. Field of the Invention

This invention relates generally to methods of fabricating semiconductor devices, and more particularly, to a trim etch process that trims or reduces the critical dimension (CD) of the gate pattern in the resist mask.

2. Discussion of the Related Art

The trend toward ultra large scale integration (ULSI) in semiconductor technology, directed toward an effort to build integrated circuits with more and faster semiconductor devices, has resulted in continued shrinking of critical dimensions of the devices. For example, in circuits having field-effect transistors, a very important process step is the formation of the gate for each of the transistors, and in particular the width of the gate. In many applications, the switching speed and size of the transistor are functions of the width of the transistor gate. A narrower gate tends to produce a higher performance, i.e., faster transistor which is also smaller in size, i.e., narrower in width.

The limitations of conventional lithographic techniques, which are used to pattern the gate during device fabrication, are quickly being realized. Accordingly, there is a continuing need for more efficient and effective fabrication processes for forming transistor gates that are smaller and/or exhibit higher performance.

One technique for achieving narrower gate width is that of trim etch, undertaken on the resist line used to form the gate. Using conventional lithographic techniques, this line may be wider than the desired gate to be formed. For example, a typical deep-UV stepper in certain embodiments provides reliable resolution capabilities down to 0.25 microns. To provide for a gate width that is less than 0.25 microns, the 0.25-micron wide resist line is isotropically etched in a controlled manner in a high-density plasma etching system until a narrower final line remains.

A problem faced with this typical trim etch process is that while it is effective in reducing line width by etching the photoresist in a horizontal direction, a significant amount of the resist is normally etched away in a vertical direction, resulting in substantial weakening and thinning of the photoresist. This significant reduction of the vertical dimension of the photoresist can promote discontinuity thereof, resulting in the photoresist being incapable of providing effective masking m the fabrication of the gate.

Therefore, what is needed is a trim etch process for reducing the critical dimension of a resist line by horizontal etching thereof, meanwhile reducing the etching of the resist line in a vertical direction.

SUMMARY OF THE INVENTION

In an embodiment of the present invention, a method is provided for trim etching a line of a resist mask which has an initial width and height. The semiconductor structure incorporating this line of the resist mask is placed in a high-density plasma etching apparatus which utilizes a variety of physical parameters to determine photoresist etch characteristics. One of these parameters, i.e., level of power supplied by a biasing power supply, is reduced to a level lower than has been conventionally used. This results in the ratio of vertical etch rate to horizontal etch rate of the resist being reduced. Thus, reduction of the width of the photo-resist line can be achieved, meanwhile with vertical etch of the resist being reduced so as to avoid the problems discussed above.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
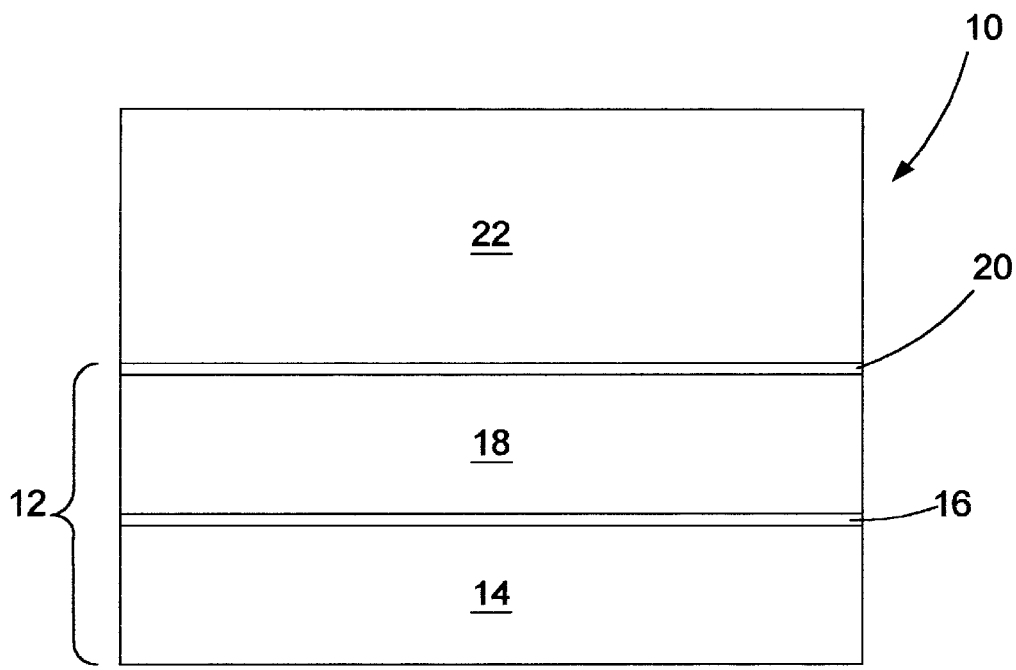
FIG. 1 is a sectional view of a portion of a semiconductor device that has been prepared for gate conductor formation.

FIG. 1 illustrates a portion 10 of a semiconductor device being fabricated on a semiconductor wafer. The portion includes a wafer stack 12 having a plurality of layers including a substrate 14, a thin oxide layer 16, and a gate conductive layer 18. As depicted, there is provided on the conductive layer 18 a bottom anti-reflective coating (BARC) 20 of for example silicon nitride (SiN), or silicon oxynitride (e.g.,SiOxNy, referred to herein simply as SiON). A resist layer 22 is provided on the BARC layer 20. By way of example, resist layer 22 is a conventional deep-UV resist material applied to BARC using conventional techniques. In one embodiment, substrate 14 includes a silicon layer, approximately 2 mm thick. In one embodiment, thin oxide layer 16 is an oxide film that may range from approximately 10 to approximately 55 angstroms thick. The conductive layer 18, in one embodiment, is a layer of polycrystalline silicon which may range from approximately 1000 to approximately 1,700 angstroms thick.

Figure 2:
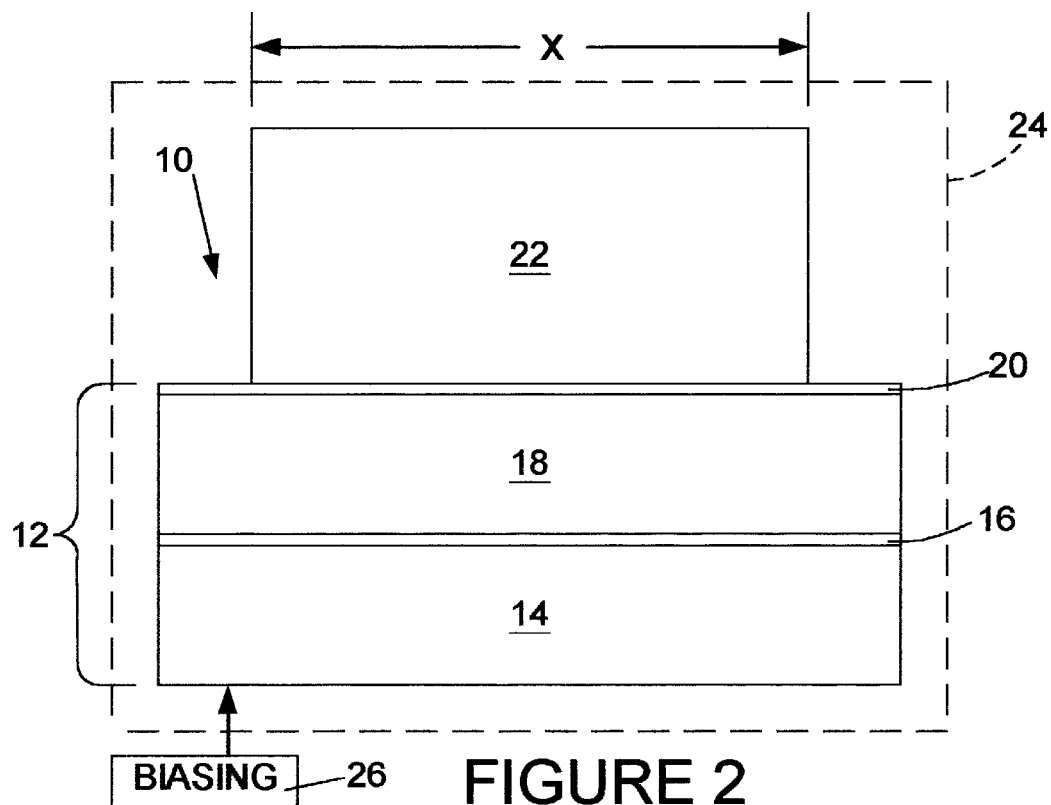
FIG. 2 is a view similar to that of FIG. 1 showing the formation of the initial resist mask in accordance with conventional practice.

Referring to FIG. 2, portion 10 is shown within a box 24 that represents a plasma reactor chamber in which etching processes are conducted. Additionally, a biasing power supply 26 is depicted as a block diagram in FIG. 2 and additional Figures. Biasing power supply 26 is a conventional power supply that is configured to supply electrical power to the plasma reactor during certain etching processes.

In conventional practice, and with reference to FIG. 2, resist mask 22, formed by conventional lithography techniques, has an initial line width X which is wider than the desired gate to be formed. A trim etch process is used to reduce the line width to dimension Y to match the desired gate width. The trim etch process includes isotropically etching away a portion of the resist line 18 to produce a final resist line that has a final width that is approximately equal to the desired gate width.

Figure 3:
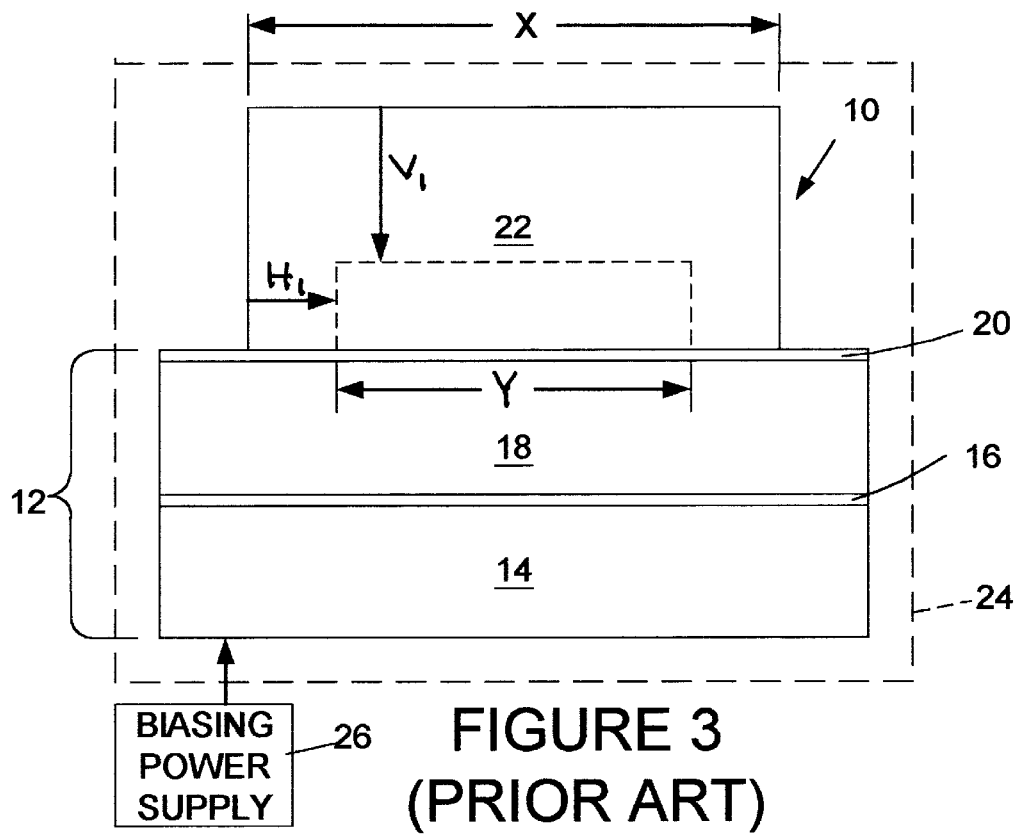
FIG. 3 is a view similar to that of FIG. 2 showing trim etch of the resist in accordance with conventional practice.

As is well known, trim etching of the resist 22, takes place in both the horizontal and the vertical directions, and in fact the rate V of etching of the resist 18 in the vertical direction may well be greater than the rate H of etching of the resist in the horizontal direction. For example, with reference to FIG. 3, assuming an initial photoresist width of X=0.25 microns, and a desired photoresist width of Y=0.15 microns, the amount of photoresist to be etched away horizontally on each side is approximately 0.05 microns. In achieving such horizontal etching, a degree of vertical etching of the resist occurs which may well be more than 0.05 microns. That is to say, and stated another way, in the conventional technique, the ratio of the vertical etch rate $V_1$ to the horizontal etch rate $H_1$ ($V_1/H_1$) of the photoresist 22 may be considered excessive, leading to the problems described above.

Figure 4:
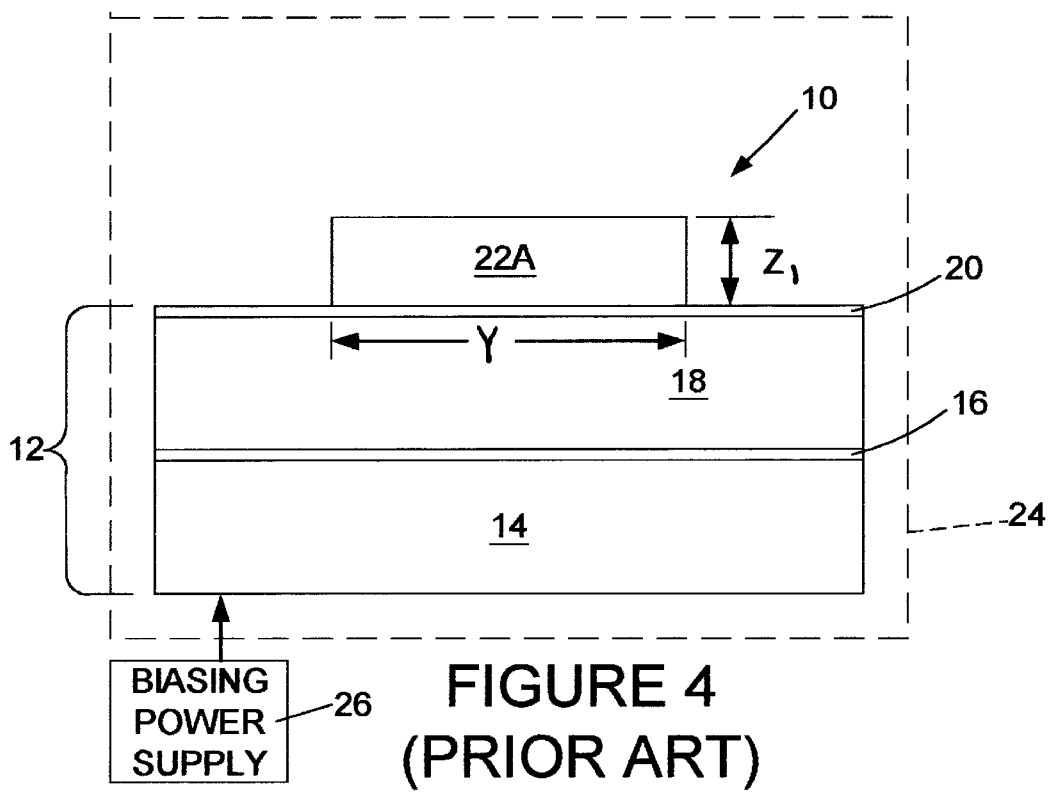
FIG. 4 is a view similar to that of FIG. 3 showing the resist in a trim etched state in accordance with conventional practice.

In a particular embodiment, and using the AMAT DPS system available from Applied Materials, with the following physical parameters;

600 watts source power 75 watts biasing power 3 mT pressure 80 sccm HBr 14 sccm $O_2$ 46 sccm Ar the vertical etch rate $V_1$ has been found to be approximately 1.4 times the horizontal etch rate $H_1$ ($V_1/H_1=1.4$). This results in the resist line taking the form 22A shown in FIG. 4, a having a horizontal dimension Y of 0.15 microns as desired, but having a vertical dimension $Z_1$ which may well be less than is desirable.

Figure 5:
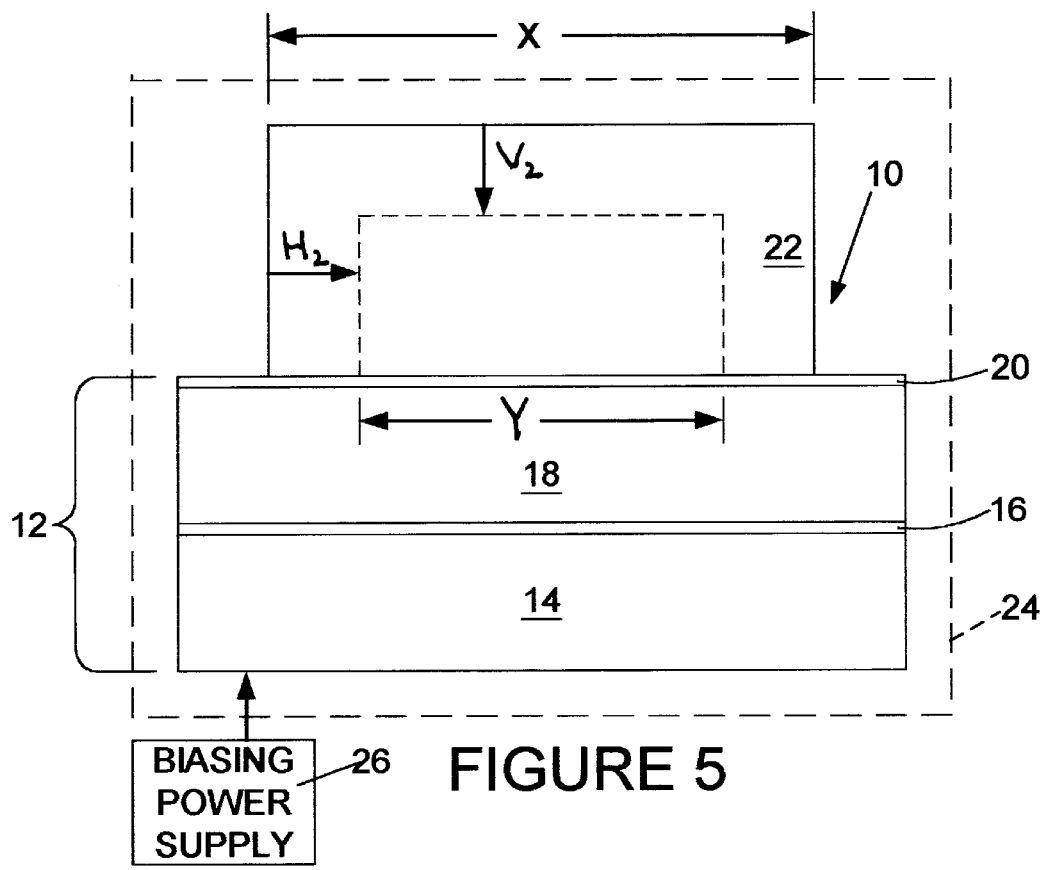
FIG. 5 is a view similar to that of FIG. 2 but showing the trim etch process of the present invention.

It has been found that reducing the level of biasing power applied during the trim etch process while holding the other physical parameters constant increases the rate of horizontal etch ($H_2$) and reduces the rate of vertical etch ($V_2$)(FIG. 5) so that the ratio of vertical etch rate to horizontal etch rate ($V_2/H_2$) is lower than $V1/H_1$, i.e., is reduced. In fact, it has been found that gradually reducing the level of biasing power from 100 watts to 45 watts gradually lowers the ratio V/H from approximately 1.4 to 1 in steps substantially directly proportional to the steps in biasing power. Thus, in this example, improvement in the ratio V/H has been achieved by lowering the level of biasing power to below 100 watts. With the lowering of the level of biasing power to below for example 90 watts, further reduction in the ratio V/H is achieved. As stated above, lowering the level of biasing power to 45 watts while maintaining other physical parameters constant in the example given above results in the ratio of rate of vertical etch to horizontal etch V/H being approximately 1, as illustrated in FIG. 5, and indeed it has been found that further reductions in the ratio V/H (i.e., to below 1) are achieved upon lowering of the applied biasing power to below 45 watts.

This advantage in trim etching the photoresist by lowering of the biasing power is achievable with the other physical parameters varying over a range, as follows:

300–1000 watts supply power

2–10 mT pressure

5–200 sccm $O_2$

5–200 sccm HBr

0–200 sccm Ar

The above described method can with advantage be practiced with the ratio of $O_2$ to HBr in the range of approximately 1:5–1:7, in particular approximately 0.175.

Figure 6:
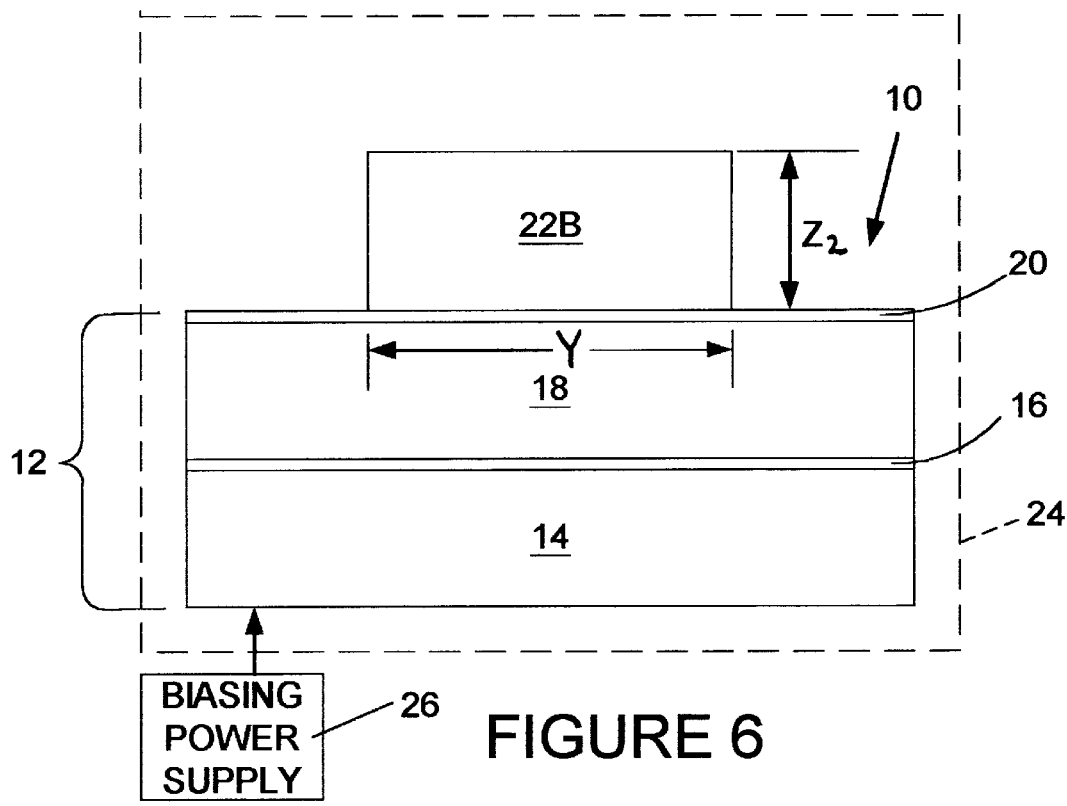
FIG. 6 is a view similar to that of FIG. 5 showing the resist in a trim etched state in accordance with the present invention.

FIG. 6 illustrates the final dimensions of a trim etch resist line 22B made in accordance with the practice of the present invention, having a final width of for example Y=0.15 microns, similar to that achieved by the previously described conventional method. However, it will be noted that in the present method the vertical dimension $Z_2$ of the final resist line 22B is substantially greater than that produced by the conventional method. This is achieved through reduction of the ratio of the vertical etch rate to horizontal etch rate V/H of the resist, as described above. It will readily be seen that the resist line 22B as shown in FIG. 6 is much less likely to have problems of discontinuity than the resist line 22A of FIG. 4.

Figure 7:
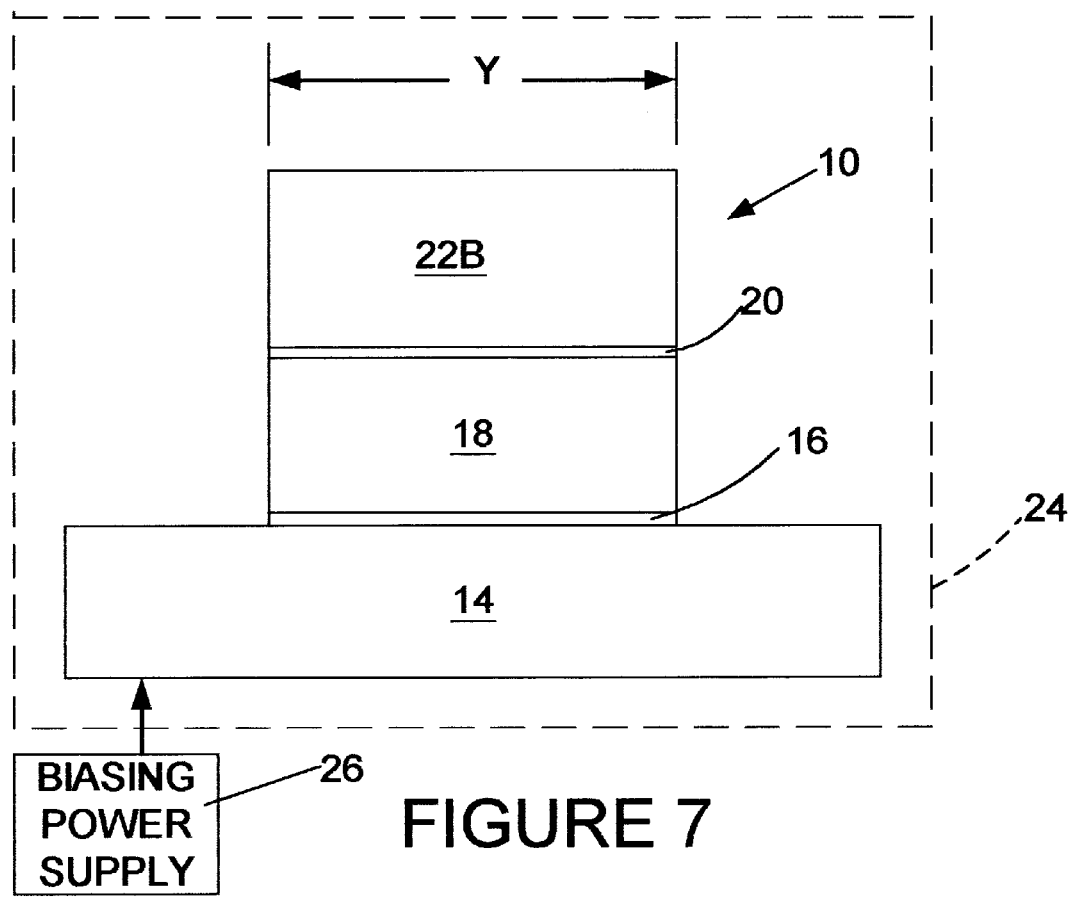
FIG. 7 is a view similar to that of FIG. 6 following a gate conductive layer etching process, in accordance with the present invention.
Figure 8:
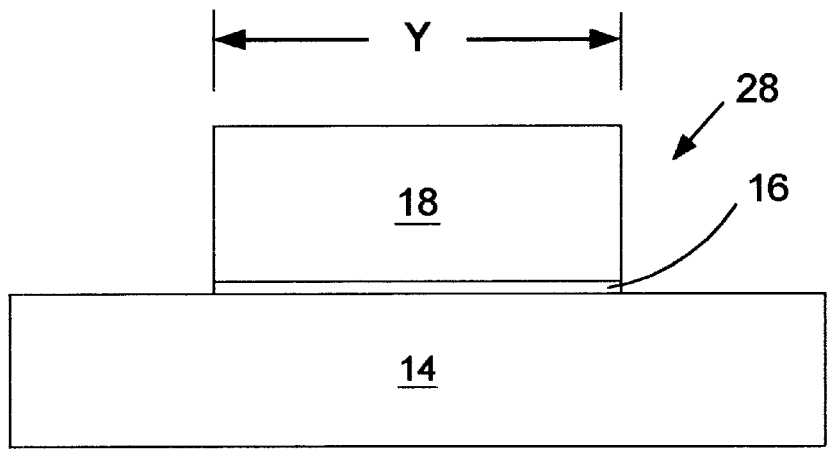
FIG. 8 is a view similar to that of FIG. 7 showing a completed gate structure in accordance with the present invention.

FIG. 7 illustrates portion 10 following a BARC etching process in which the pattern of final resist line 22B is essentially transferred to BARC 20 by anisotropically etching away exposed portions of BARC 20, and further illustrates gate conductive layer 18 etching, removing exposed portions of the gate conductive layer 18 and oxide layer 16. The result of this process is that gate 28 is formed having substantially the same width Y as the final line 22B. As a result, the gate 28 is fully exposed (FIG. 8) and can then be used to form completed transistors in the subsequent fabrication processes.

The present process succeeds in reducing width of a photoresist line by horizontal etching thereof. Furthermore, the present trim process has the advantage that vertical etching of the photoresist line is reduced, so that integrity and strength of the resist line are maintained, in turn assuring that subsequent processing can be properly achieved.

The foregoing description of the embodiment of the invention has been presented for purposes of illustration and description. It is not intended to be exhaustive or to limit the invention to the precise form disclosed. Other modifications or variations are possible in light of the above teachings. The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled. Furthermore, as will be understood by those skilled in the art, the structures described herein may be made or used in the same way regardless of their position or orientation. Accordingly, it is to be understood that terms and phrases such as "vertical" and "horizontal" as use herein refer to relative location and orientation of various portions of the structure with respect to one another, and are not intended to suggest that any particular absolute orientation with respect to external objects is necessary or required.

What is claimed is:

1. A method of trimming photoresist of a semiconductor structure comprising:

providing the semiconductor structure in a plasma etch apparatus which uses a number of physical parameters for determining photoresist etch characteristics; and varying the ratio of vertical etch rate to horizontal etch rate of the photoresist by selectively varying at least one of the physical parameters determining photoresist etch characteristics.

2. A method of trimming photoresist of a semiconductor structure comprising:

providing the semiconductor structure in a plasma etch apparatus which uses a number of physical parameters for determining photoresist etch characteristics; and varying the ratio of vertical etch rate to horizontal etch rate of the photoresist by selectively varying the level of biasing power applied to the plasma etch apparatus.

3. A method of trimming photoresist of a semiconductor structure comprising:

providing the semiconductor structure in a plasma etch apparatus which uses a number of physical parameters for determining photoresist etch characteristics; and reducing the ratio of vertical etch rate to horizontal etch rate of the photoresist by selectively varying at least one of the physical parameters determining photoresist etch characteristics.

4. A method of trimming photoresist of a semiconductor structure comprising:

providing the semiconductor structure in a plasma etch apparatus which uses a number of physical parameters for determining photoresist etch characteristics; and reducing the ratio of vertical etch rate to horizontal etch rate of the photoresist by reducing the level of biasing power applied to the plasma etch apparatus.

* * * * *